United States Patent
Stucki et al.

(10) Patent No.: US 6,358,382 B1
(45) Date of Patent: Mar. 19, 2002

(54) RETAINING RING AND TARGET AND METHOD FOR PRODUCING SAME

(75) Inventors: Hans-Ulrich Stucki, Trübbach (CH); Wolfgang Siegl, Meiningen (AT)

(73) Assignee: Unaxis Balzers Aktiengesellschaft, Furstentum (LI)

( * ) Notice: Subject to any disclaimer, the term of this patent is extended or adjusted under 35 U.S.C. 154(b) by 0 days.

(21) Appl. No.: 09/673,152

(22) PCT Filed: Apr. 12, 1999

(86) PCT No.: PCT/EP99/02447

§ 371 Date: Nov. 21, 2000

§ 102(e) Date: Nov. 21, 2000

(87) PCT Pub. No.: WO99/54910

PCT Pub. Date: Oct. 28, 1999

(30) Foreign Application Priority Data

Apr. 16, 1998 (EP) .............................. 98106874

(51) Int. Cl.$^7$ .............................. C23C 14/34; B23B 3/00
(52) U.S. Cl. .............................. 204/298.12; 204/298.11; 82/1.11
(58) Field of Search ....................... 204/298.11, 298.12; 82/1.11

(56) References Cited

U.S. PATENT DOCUMENTS 5,763,851 A * 6/1998 Forster et al. ......... 219/121.43
6,231,674 B1 * 5/2001 Chen et al. ................. 118/720

FOREIGN PATENT DOCUMENTS

JP 61-67768 * 4/1986 ........... C23C/14/34

OTHER PUBLICATIONS

Translation of International Preliminary Examination Report of PCT/EP99/02447.

* cited by examiner

*Primary Examiner*—Nam Nguyen
*Assistant Examiner*—Steven H. VerSteeg
(74) *Attorney, Agent, or Firm*—Notaro & Michalos P.C.

(57) ABSTRACT

In order to simplify its production, a target consists of a target plate (1) and a retaining ring (2) which is mounted thereon and can be inserted in the manner of a bayonet lock into a receiving orifice of a holding device (4). A downward-facing stop (8) on the inside of the retaining ring (2), whose upper surface is flush with that of the target plate (1), cooperates with an opposite stop (7) on the latter, which is produced in a simple manner by producing an all-round step, for example by turning. The lower surface of the target plate (1) projects beyond that of the retaining ring (2), so that a metal foil (9) is pressed against its lower surface under the action of a cooling liquid under pressure, and, via the opposite stop (7) and the stop (8), presses upward-facing fastening cheeks (5) of the retaining ring (2) against retaining projections (6) of the holding device (4).

10 Claims, 1 Drawing Sheet

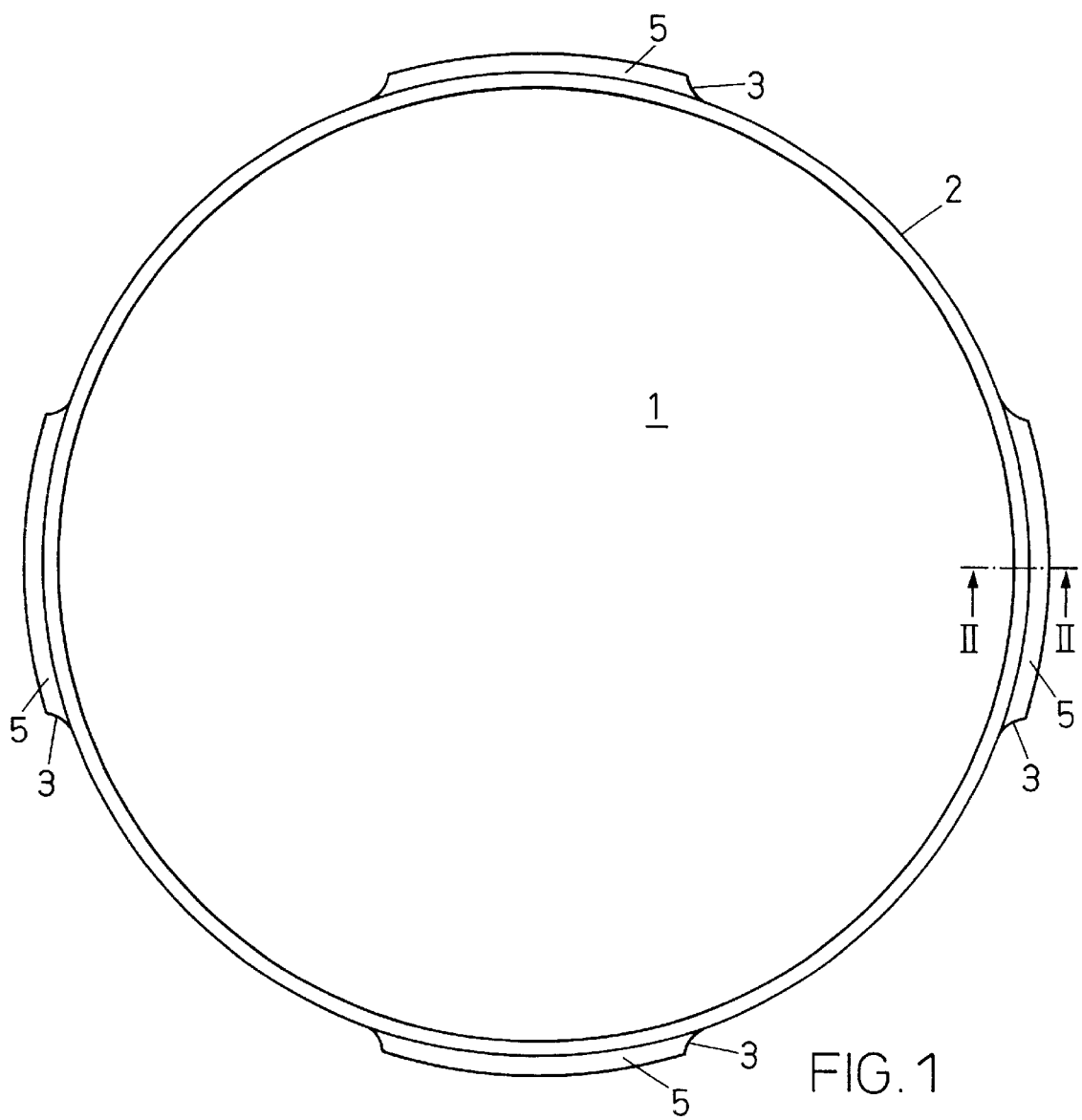
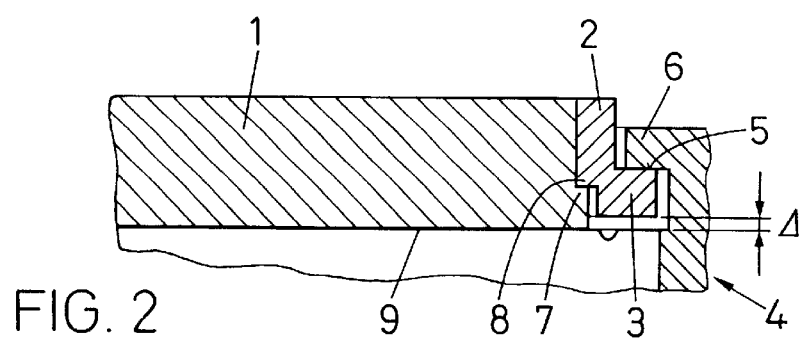

RETAINING RING AND TARGET AND METHOD FOR PRODUCING SAME

The invention relates to a retaining ring for fastening a target plate in a holding device of a process room, in particular of a vacuum chamber, a target which comprises such a retaining ring and a target plate and a process for its production. Targets are used in various coating processes in which the surface of the target plate is atomized or vaporized by ion bombardment and the particles released are deposited on a workpiece. The target is gradually consumed.

EP-A-0 499 770 discloses a target which is produced as a single piece from target material and has anchoring extensions which project radially outwards and are distributed uniformly over its circumference, separated by spaces and recessed relative to an upper surface of the target and serve for anchoring the target in a holder. The holder has corresponding inward-pointing retaining projections which, after rotation of the target, grip above the anchoring extensions so that said target is fixed in the manner of a bayonet lock, the anchoring extensions additionally being pressed against the retaining projections by a metal foil of a cooling device, which metal foil presses against the underside of the target. This has the disadvantage that the anchoring extensions in each of the relatively rapidly consumed targets has to be produced by a complicated processing procedure, a relatively large part of the often expensive target material being lost in certain circumstances.

It is the object of the invention to provide a target fastening, in which the shape of the target plate consisting of target material need not meet particular demands predetermined by the requirements of its anchoring, and a corresponding target. This object is achieved by the features in the characterizing clause of claim 1 and of claim 6. In addition, it is intended to provide a particularly simple production process for the target. This object is achieved by the features in the characterizing clause of claim 10.

The advantages achieved by the invention are in particular that the target function is decoupled from the anchoring function and therefore at most very simple machining ensuring an adequate connection to the retaining ring performing the anchoring need be carried out on the target material. On the other hand, the retaining ring which carries the anchoring extensions has a complicated shape consists of a resistant material and is reusable. The proposed machining of the target plate is very simple to carry out and results in only small losses of material.

The invention is explained in more detail below with reference to Figures, which show only an embodiment.

FIG. 1 shows a plan view of a target according to the invention and

FIG. 2 shows a section along II—II in FIG. 1, through the target and through a part of a holding device.

The target consists of a flat round target plate 1 of a material suitable for the respective coating process, e.g. aluminium. A retaining ring 2 is pushed onto said target plate and surrounds it so that its inner surface rests against the outer surface of said target plate. Said retaining ring consists of a resistant material, e.g. titanium. The upper surface of the retaining ring 2 is flush with the upper surface of the target plate 1. Said upper surface forms a narrow ring whose area is negligible compared with the surface area of the target plate 1. On its outer surface, the retaining ring 2 has four anchoring extensions 3 which are uniformly distributed over its circumference, project radially outward and are separated by relatively large spaces and recessed relative to the upper surface by about two thirds of the height of the retaining ring 2. They serve for anchoring the target in a holding a device 4 and form upward-pointing fastening cheeks 5 which, in the locking position shown in FIG. 2 and achieved by inserting and rotating the target 1, press against the lower surfaces of four retaining projections 6 which project inwards and are likewise uniformly distributed over the circumference of a receiving orifice of the holding device 4 and grip above the anchoring extensions 3.

On the outside of the target plate 1, an all-round step forms an upward-facing opposite stop 7 which cooperates with a corresponding downward-facing stop 8 on the inside of the retaining ring 2, which stop is formed by an all-round step and is therefore slightly recessed relative to the lower surface of the retaining ring 2 but is below the fastening cheeks 5. The opposite stop 7 on the target plate 1 can be produced in a simple manner, and with little loss of material, from a cylindrical plate of uniform thickness by creating this step, for example, by turning the cylindrical plate and removing material from the upper surface thereof. The opposite stop 7 is adjusted so that its distance from the lower surface of the target plate 1 is greater than that of the stop 8 on the retaining ring 2 from its lower surface so that the target plate 1 projects downwards by a height difference Δ above the likewise flat lower surface of the retaining ring 2.

Consequently, a metal foil 9 of the holding device 4, behind which a cooling liquid under pressure is fed for cooling the target plate 1, presses against its lower surface where it is a distance away from the retaining ring 2. In this way, not only is optimum heat transfer achieved but also a contact pressure is generated, via the opposite stop 7 and the stop 8, between the fastening cheeks 5 and the lower surfaces of the retaining projections 3 and the target is securely clamped in the holding device 4.

A little play remains laterally between the target and the holding device 4, so that no stresses occur in the event of thermal expansion of the target, which can reach a relatively high temperature, e.g. 400° C., during the coating process. The target plate 1 may be subjected to a somewhat greater thermal expansion than the retaining ring 2, so that these parts clamp together during the coating process. After cooling of the target, however, the retaining ring 2 can be removed, so that it presents no further problems.

Various modifications in the formation of the retaining ring and also of the target plate are possible. Thus, for example, the opposite stop can also be formed by that part of its lower surface which is adjacent to the inner edge of the retaining ring, instead of by a step. The stop and opposite stop may also have a conical shape.

What is claimed is:

1. Retaining ring (2) having an upper surface, a lower surface, an outside and an inside, and for fastening a target plate (1) in a holding device (4) of a process room, characterized in that the retaining ring has, on the outside, a plurality of anchoring extensions (3) which project radially outwards and are distributed over its circumference and separated by spaces and form fastening cheeks (5) which face the upper surface of the retaining ring (2) and are intended for anchoring said retaining ring in the holding device (4) and, on the inside, a stop (8) facing the lower surface of the retaining ring (2).

2. Retaining ring (2) according to claim 1, characterized in that it has at least three anchoring extensions (3) which are identically formed and uniformly distributed.

3. Retaining ring (2) according to claim 1, characterized in that the fastening cheeks (5) are recessed relative to an upper edge of the retaining ring (2).

4. Retaining ring according to claim 1, characterized in that the stop (8) is recessed relative to a lower surface of said retaining ring.

5. Retaining ring according to claim 4, characterized in that the stop (8) is formed by an all-round step.

6. Target comprising a target plate (1) and a retaining ring (2) according to claim 1, characterized in that the retaining ring (2) surrounds the target plate (1) and the target plate has, at its edge, an upward-facing opposite stop (7) which rests against the stop (8) of the retaining ring (2).

7. Target according to claim 6, characterized in that the target plate has a lower surface and the lower surface of the target plate (1) projects relative to the lower surface of the retaining ring (2).

8. Target according to claim 6, characterized in that the target plate has an upper surface and the opposite stop (7) is recessed relative to the upper surface of the target plate (1) and the upper surface of the target plate is flush with the upper surface of the retaining ring (2).

9. Target according to claim 6, characterized in that the opposite stop (7) of the target plate (1) is in the form of an all-round step.

10. Process for the production of a target according to claim 9, characterized in that the all-round step is created on the target plate (1) by turning a cylindrical plate of uniform thickness.

* * * * *